United States Patent [19]

Taylor

[11] 4,232,110
[45] Nov. 4, 1980

[54] SOLID STATE DEVICES FORMED BY DIFFERENTIAL PLASMA ETCHING OF RESISTS

[75] Inventor: Gary N. Taylor, Fanwood, N.J.

[73] Assignee: Bell Telephone Laboratories, Incorporated, Murray Hill, N.J.

[21] Appl. No.: 19,711

[22] Filed: Mar. 12, 1979

[51] Int. Cl.$^2$ .......................... H05K 3/00; G03C 5/00
[52] U.S. Cl. .................................... 430/313; 156/643; 156/659.1; 477/96; 430/311; 430/321; 430/967
[58] Field of Search ................. 96/36.2; 156/643, 659; 427/43, 53, 96; 430/313, 311

[56] References Cited

U.S. PATENT DOCUMENTS

| 3,809,732 | 5/1974 | Chandross et al. | 264/22 |
| 3,816,196 | 6/1974 | La Combe | 156/8 |
| 3,816,198 | 6/1974 | La Combe et al. | 156/16 |
| 3,916,035 | 10/1975 | Brewer | 427/43 |
| 3,953,620 | 4/1976 | Chandross et al. | 427/53 |

FOREIGN PATENT DOCUMENTS

2726813 12/1977 Fed. Rep. of Germany .

OTHER PUBLICATIONS

"Photolocking-A New Technique for Fabricating Optical Waveguide Circuits," E. A. Chandross et al., Applied Physics Letters, vol. 24, No. 2, Jan. 15, 1974, pp. 72–74.

"Optical Directional Couplers and Grating Couplers Using a New High-Resolution Photolocking Material," W. J. Tomlinson et al., Applied Physics Letters, vol. 26, No. 6, Mar. 15, 1975, pp. 303–306.

"Adhesion and Release Layer for Resist Structures," E. C. Fredericks, IBM Technical Disclosure Bulletin, vol. 20, No. 3, Aug. 1977, p. 992.

Primary Examiner—John D. Smith
Attorney, Agent, or Firm—Peter V. D. Wilde

[57] ABSTRACT

A process of dry etching to form negative resist patterns is described. A host polymer is mixed with one or more monomers capable of being locked into place by electromagnetic radiation and is deposited as a film on a substrate. The film is then selectively irradiated, and then fixed by heating, or vacuum, or both, and etched by means of an oxygen plasma. The rate of removal is higher in the unirradiated region than in the irradiated region, yielding a negative resist pattern. A sensitizer may be added to allow use of various radiation wavelengths. The desirable properties of monomer and host polymer materials are discussed, and specific compositions given of aromatic monomers, silicon containing monomers, and chlorinated polymers.

34 Claims, 5 Drawing Figures

SOLID STATE DEVICES FORMED BY DIFFERENTIAL PLASMA ETCHING OF RESISTS

BACKGROUND OF THE INVENTION

This invention relates to producing solid state devices by a plasma processing technique for feature delineation. More particularly, the invention relates to plasma etching of an irradiated resist film having at least one type of monomer locked into a host polymer to produce the desired negative resist pattern.

The making of photoresist or X-ray resist patterns used in the production of integrated circuits and other electronic devices normally requires the use of liquid chemical developing solutions. These solutions dissolve away either a previously irradiated portion of the resist, or the unirradiated portion, producing either a positive or negative tone resist pattern. The irradiated regions normally define the circuit geometry of the device, and so the ability of the liquid developer-resist combination to accurately reproduce the geometry desired is important.

One of the main factors limiting the ability of liquid developing techniques in achieving linewidths of approximately 1 $\mu$m and less is the absorption of the developing solution by the resist during development. Such absorption causes the resist to swell in many cases, which distorts the linewidths and degrades the resolution obtainable. In addition, such absorption produces stresses in the resist film, which may cause the film to lose adhesion to the substrate.

While such absorption effects can be minimized by a judicious choice of developer and rinsing solvents, resolution is still limited to about 2 $\mu$m gaps in 5000–7000 Angstroms final resist thickness for most current negative resists. Positive resists generally provide better resolution, but normally with reduced radiation sensitivity and inferior adhesion.

One way to avoid liquid developers is to use a plasma etch, such as oxygen excited by a radio frequency source. Plasmas have been used for several years to etch substrate materials, or for stripping away photoresists after a conventional liquid etch. They have also been used for selective etching when the pattern to be etched has first been defined by conventional means; see U.S. Pat. Nos. 3,816,196; 3,816,198. However, the use of plasmas to etch the pattern in the first instance is known by the present inventor is only one previous publication, German Pat. No. (Offen) 27 26 813.

SUMMARY OF THE INVENTION

I have invented a new technique for producing negative resist patterns. It makes use of a plasma having a differential rate of etch in the irradiated and unirradiated regions of the resist. Since it is a dry etching process, the resolution is not limited by swelling of the resist due to absorption of developing solution. The pattern may be formed directly on a wafer or an intermediate layer on a wafer for making semiconductor devices such as large scale integrated circuits, or other solid state devices, such as bubble memories. Alternately, the pattern may be used to form a master mask that is separate from the device being produced.

In this technique, a polymer host material is mixed with one or more types of monomer, said monomer or monomers forming a "monomer material" that is sensitive to electromagnetic radiation in said polymer. The resulting material, usually dissolved in a liquid solvent, is coated onto a substrate and the solvent is allowed to evaporate. The resulting film is selectively irradiated by the proper wavelength radiation, such as visible or ultraviolet light, or X-rays, either directly or through a mask that delineates the desired pattern on the resist film. This radiation exposure produces a change in the monomer material, such that the monomer or monomers dimerize, polymerize, or attach, or graft to the host polymer, or any combination of the foregoing, which reduces the mobility of the monomer material in the irradiated portion of the polymer host. The resist film is then fixed by means of heating, or a vacuum, or both, which drives out the monomer material from the unirradiated portion of the film. However, due to its decreased mobility, the monomer material in the irradiated portion of the film is retained in the host polymer.

The resist film is then etched by means of a plasma, which preferentially removes material from the host-polymer-only portion of the film. Although the monomer-retained portion of the film is also attacked by the plasma, it is removed at a slower rate than the polymer-only portion. When the polymer-only portion has been removed down to the substrate, a resist pattern is obtained which corresponds to the radiation pattern, hence yielding a negative tone resist pattern.

BRIEF DESCRIPTION OF THE DRAWINGS

FIG. 1 shows a monomer-polymer film on a substrate being selectively irradiated.

FIG. 2 shows some of the types of chemical links that can form in the irradiated region.

FIG. 3 shows the film after removal of the unlinked monomers.

FIG. 4 shows the negative resist pattern remaining after plasma etching.

DETAILED DESCRIPTION

Figure 1:
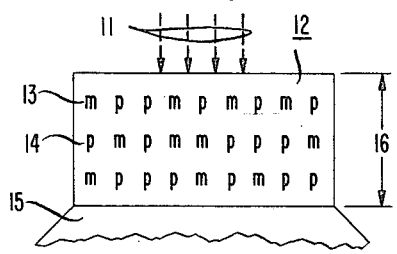
FIGS. 1–4 show schematically the steps involved in making a negative resist pattern by differential plasma etching.
Figure 2:
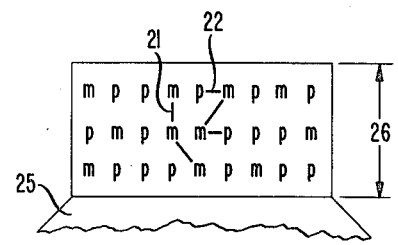

The following description covers new negative resist material and a dry etch development process. The materials are mixtures of a host polymer of low volatility and one or more moderately volatile monomers which are locked into the host polymer by electromagnetic radiation. The unlocked monomer material is then substantially removed from the film by heating, or a vacuum, or both. Pattern development is accomplished by exposure to a plasma. The overall procedure is given schematically in FIG. 1 through FIG. 4. In FIG. 1, a resist layer 12 comprising a mixture of monomer 13 and host polymer 14 molecules is shown formed on substrate 15. The resist layer is selectively irradiated by a beam of electromagnetic radiation 11, either directly or through a mask (not shown). FIG. 2 shows how the monomer material may form links 21 and 22 in the irradiated region. Link 21 is between two monomers, which may be of the same or different monomer types, while link 22 is between a monomer and a host polymer.

The linking of two monomers, whether of the same or different types, is hereafter referred to as dimerization. The linking of more than two monomers in a chain is referred to hereafter as polymerization, whether the monomers in the chain are of the same or different types. The linking of a monomer to a host polymer is referred to hereafter as attachment, and the attachment of a monomer followed by the linking of one or more monomers to the attached monomer is referred to as grafting, again whether the monomers are of the same or different types. As indicated by FIG. 2, the monomers outside the irradiated region remain unlinked.

Figure 3:
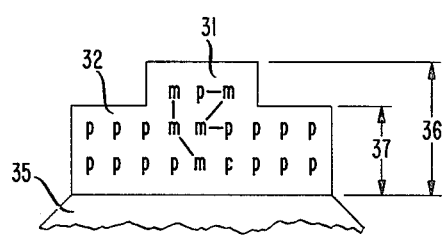
Figure 4:
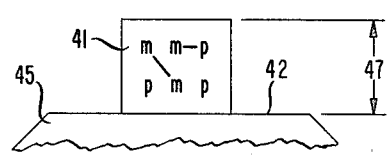

FIG. 3 shows that the unlinked monomers in the unirradiated region 32 have been removed by a fixing process, which may include heating the resist, possibly aided by a vacuum, or by means of a vacuum alone. In some cases, depending on the volatility of the materials used, fixing may be accomplished by allowing the film to remain at room temperature and pressure for a given period of time. The only monomers remaining are those that have become linked, which occurs only in the radiated region 31. The unirradiated region from which the monomers have been removed may be slightly thinner than the irradiated region, typically on the order of 1000 Angstroms thinner and typically 700 Angstroms thinner with the examples given below. This is due to the greater loss of monomer material from the unirradiated region. In FIG. 4, the final resist relief pattern is shown after etching in a plasma, usually at an elevated temperature. The plasma etched the host-polymer-only region at a faster rate than the region containing the linked monomers. This leaves resist pattern 41 in the irradiated region and bare substrate 42 in the unirradiated region, thus creating a negative tone resist pattern.

The "differential etch ratio" as used herein means the ratio of the thicknesses of material removed in a given amount of time by plasma etching in the unirradiated versus the irradiated regions of the resist. For example, starting with a 10,000 Angstrom (1 μm) thick resist material on a substrate, which after radiation and fixing is 9500 Angstroms thick in the irradiated region and 8800 Angstroms thick in the unirradiated region, plasma etching proceeds until all the material is just removed from the unirradiated region down to the substrate. At this point, 1500 Angstroms of material is left in the radiated region. The differential etch ratio is then:

(8800−0)/(9500−1500)=8800/8000=1.10.

The differential plasma etch phenomenon has been observed by the present inventor thus far for monomers containing aromatic functionality, herein also referred to as aromatic monomers, and various chlorinated polymers. The most promising results thus far, in terms of high sensitivity to X-radiation, ease of removing the unlocked monomer (fixing), and high differential etch ratio, have been obtained with the chlorinated polymer poly(2,3-dichloro-1-propyl acrylate), herein also referred to as DCPA. Unless otherwise noted, the radiation source used for obtaining the results herein is an X-ray source emitting at approximately 4.4 Angstroms. This results from electron bombardment of a palladium target, and the resulting electromagnetic radiation at the Lα emission line, herein also referred to as $Pd_{L\alpha}$ radiation. However, persons skilled in the art will recognize that other target material, and other sources of X-radiation, including synchrotron radiation, can be used.

A variety of moderately volatile aromatic monomers can be locked into DCPA by irradiation with $Pd_{L\alpha}$ X-rays. The most significant examples found thus far are given in Table 1 below. In particular, all the monomers shown have one or more unsaturated polymerizable functional groups, which allows for polymerization by the chain mechanism. This is desirable in order to build gain into the polymerization process, which provides for high sensitivity to radiation. In addition, vinyl groups, styrol groups, acrylic groups, or methacrylic groups are provided, as these have especially favorable propagation rates relative to their termination rates, again providing for high sensitivity to radiation. In general, the ratio of the polymerization rate constant $K_p$ (liters/mole-sec.) to the termination rate constant $K_t$ (liters/mole-sec.) at 30 degrees C. is greater than $1 \times 10^{-6}$ for the materials shown.

TABLE I

Properties of DCPA-Monomer Mixtures As Plasma-Developed X-Ray Resists (X-Ray Flux 2 mj/cm²/min.)

| Monomer | Wt. % | Radiation (Min.) | $NT_r$ | $NT_d$ |
|---|---|---|---|---|
| N-Vinylcarbazole (NVC) | 5 | 1.0 | .02 | .08 |
|  | 10 | 1.0 | .04 | .11 |
|  | 15 | 1.0 | .06 | .14 |
|  | 20 | 1.0 | .07 | .18 |
|  | 25 | Monomer Crystallized | | |
| N-Phenylmaleimide (NPM) | 10 | 2.5 | .02 | .19 |
|  | 20 | 2.5 | .01 | .15 |
|  | 30 | 2.5 | Trace | .10 |
| Acenaphthylene | 20 | 2.5 | .04 | .14 |
|  | 30 | Monomer Crystallized | | |
| 2-Vinylnaphthalene | 15 | 2.5 | .05 | .17 |
| Hydroquinone Dimethacrylate | 12.5 | 2.5 | .08 | .09 |
|  | 25 | Monomer Crystallized | | |
| Ethyleneglycol Dimethacrylate | 20 | 2.5 | .04 | .04 |
| Diphenyldivinyl-silane | 5.0 | 0.5 | Trace | .02 |
|  | 5.0 | 1.0 | Trace | .07 |
|  | 30.0 | 2.5 | Trace | .12 |

Figure 5:
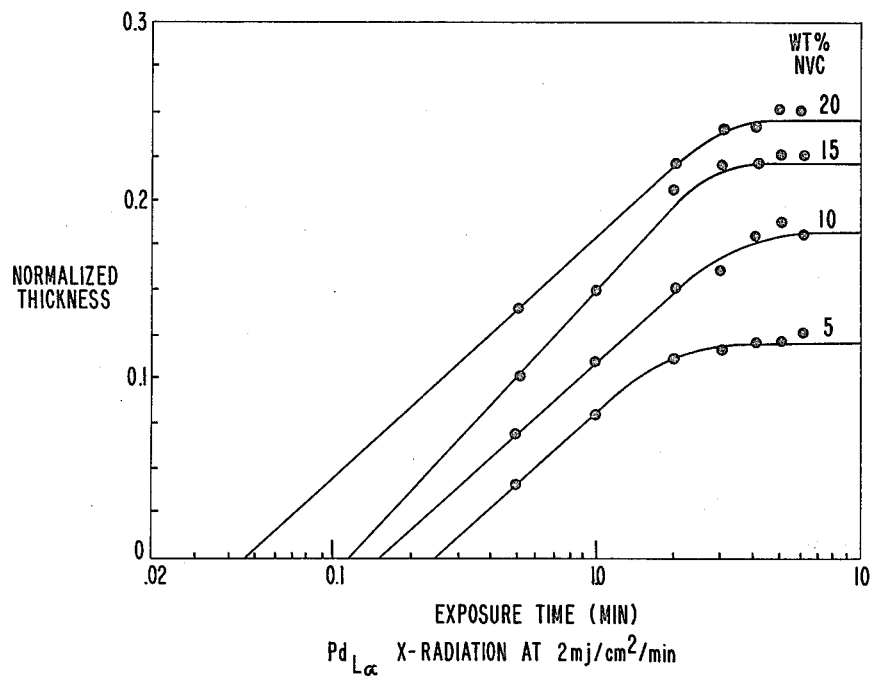
FIG. 5 shows the sensitivity curves for various percentages of N-vinylcarbazole in a poly(2,3-dichloro-1-propyl acrylate) host polymer.

All mixtures were developed after irradiation and heating for 1 hour at 90 degrees C. and 0.1 torr by treatment with an unshielded rf-generated oxygen plasma in an International Plasma Corporation 2005T-1813SCA Etcher. Samples were held horizontally on an Al or quartz table at the bottom of the reactor. Etching was conducted using a power of 100 watts at a pressure of 0.60 torr and a temperature range from 25–60 degrees C. as measured by a temperature probe mounted in the etch chamber. The normalized thickness of the relief image after fixing is designated $NT_r$, and is the difference in thickness of the irradiated and unirradiated regions divided by the initial thickness of the resist, which in all the cases shown is 1 μm. The normalized thickness after plasma etching, for the radiation dose given in Table 1, is designated $NT_d$. Since the plasma has etched the unirradiated region down to the substrate (zero thickness), $NT_d$ is simply the thickness of the irradiated region after etching divided by the initial thickness of the resist. Examples of typical sensitivity curves are given in FIG. 5 for mixtures of DCPA and N-vinylcarbazole (NVC), the monomer (other than silicon containing monomers, to be discussed below) for which the most promising results have been obtained. Each point on the sensitivity curve is determined relative to complete clearing of the unirradiated portion of the 1 μm lines and spaces. Thus, the resolution is identical for each point on the curve. Note that each curve appears to have a maximum normalized thickness which is independent of additional X-ray dose. The optimum weight percentage of NVC in DCPA is about 19 percent, which yields a relatively high differential etch ratio. Substantially higher percentages of NVC in DCPA lead to crystallization of the NVC monomer.

There are several reasons why polymerizable aromatic monomers are suitable as the monomer material with a host nonaromatic polymer. Firstly, at least some aromatic monomers can be locked into polymeric hosts by radiation techniques; see E. A. Chandross, C. A. Pryde, W. J. Tomlinson and H. P. Weber, "Photolocking—a New Technique for Fabricating Optical Waveguide Circuits", *Appl. Phys. Lett.*, Vol. 24, No. 2, pp. 72-74 (1974). This work formed the basis for U.S. Pat. No. 3,809,732.

Secondly, the introduction of aromatic functional groups into resist materials leads to enhanced resistance to plasma processing, and hence to a lower removal rate.

An additional advantage, which aids in the achievement of high aspect ratios, is that if the fixing temperature is not too high, polymerization of the above-named aromatic monomers is not thermally initiated by the heating required to remove unreacted monomer from the unirradiated region. Also, the aromatic monomers given above have moderate volatility. It is necessary that the volatility not be too high, or else the monomer material will evaporate from the host polymer before, and while, being locked in place by radiation. On the other hand, volatility should not be too low, or the heating time necessary to drive the unlocked, unirradiated monomer material out of the host polymer will be so long, or the heating temperature so high, as to thermally lock the monomer material in place. Such thermal locking reduces the differential etch ratio.

It has further been discovered that monomers containing silicon have increased differential etch ratios for a given amount of locked monomers as compared with the nonsilicon containing monomers used thus far. As shown in Table 1, diphenyldivinylsilane has a high $NT_d$ value, even though the $NT_r$ value is small. This shows that only a small proportion of this silicon monomer is locked into the polymer host, since the $NT_r$ value is roughly proportional to the amount of locked monomer remaining after fixing. However, the relatively high $NT_d$ values show that the locked silicon monomer is highly resistant to oxygen plasma etching.

Surprisingly, it has further been discovered that the presence of a nonsilicon monomer along with the silicon monomer increases the differential etch ratio still further. As shown in Table II, the addition of NVC in various percentages increases $NT_d$ above what is obtained for the diphenyldivinylsilane or the NVC alone. In addition, the presence of NVC allows a film composition with a silicon monomer, dimethylphenyl-4-vinylphenylsilane, that has been found to otherwise be incompatible in DCPA.

TABLE II

Properties of Three-Component Mixtures As Plasma-Developed X-Ray Resists
(X-Ray Flux 2.9 mj/cm²/min.)

| Monomer 1 | Monomer 2 | Wt. % 1 | Wt. % 2 | Wt. % DCPA | Rad. Time (min.) | $NT_r$ | $NT_d$ |
|---|---|---|---|---|---|---|---|
| NVC | — | 19 | 0 | 81 | 1.0 | 0.07 | 0.16 |
| NVC | Dimethylphenyl-4-vinylphenylsilane | 5 | 15 | 80 | 1.0 | 0.05 | 0.16 |
| NVC | Dimethylphenyl-4-vinylphenylsilane | 10 | 10 | 80 | 1.0 | 0.08 | 0.21 |
| NVC | Dimethylphenyl-4-vinylphenylsilane | 15 | 5 | 80 | 1.0 | 0.05 | 0.22 |
| NVC | Dimethylphenyl-4-vinylphenylSilane | 15 | 15 | 70 | 1.0 | 0.09 | 0.19 |
| NVC | Diphenyldivinylsilane | 15 | 7.5 | 77.5 | 1.0 | 0.08 | 0.22 |
| NPM | — | 10 | — | 90 | 2.0 | — | 0.17 |
| NPM | Dimethylphenyl-4-vinylphenylsilane | 16.7 | 16.7 | 66.6 | 2.0 | — | 0.28 |

The choice of polymeric host is also important, for it should have a high plasma removal rate and be capable of initiating polymerization upon absorption of X-radiation. Unlike the photolocking experiments of Chandross and coworkers above, in which all the irradiating light was absorbed by the monomer, the $Pd_{L\alpha}$ X-radiation here is absorbed primarily by the host polymer. Thus far, poly(2,3-dichloro-1-propyl acrylate) appears to be the preferred host for it has a very high removal rate in an $O_2$ plasma, a high absorption to $Pd_{L\alpha}$ X-rays, and a favorable initiation rate, especially for cationically initiated polymerizations. In addition many monomers are highly soluble in DCPA and it can be prepared in quantity.

The high etch rate is apparently due to the presence of chlorine atoms in the side chains of the DCPA. These chlorine atoms act as a catalyst that aids in breaking the backbone of the polymer chain. It is this combination of an anomalously high etch rate in an oxygen plasma and a high rate of initiating polymerization of irradiated monomers that makes the chlorinated polymers, and in particular DCPA, the best host polymer materials found thus far. Other chlorinated polymers have been tested with NVC as the sole monomer, with results indicated in Table III. To show the relative rates of removal of each polymer in an oxygen plasma, poly(styrene) has been chosen as a reference, with an arbitrary assignment of its removal rate as 1.0. To obtain a high differential etch ratio, the polymer should not be an aromatic polymer, if an aromatic monomer or monomers are used.

TABLE III

Properties of NVC-Polymer Mixtures
As Plasma-Developed X-ray Resists
(X-ray Flux 2.0 mj/cm$^2$/min.)

| | Rel. Rate of Plasma Removal | Wt. % Monomer | Rad. Time (Min.) | $NT_r$ | $NT_d$ |
|---|---|---|---|---|---|
| Poly(2,3-dichloro-1-propyl acrylate) | 13.0 | 19 | 2.0 | .10 | .22 |
| Poly(1,3-dichloro-2-propyl acrylate) | 13.2 | 30 | 2.0 | .06 | .14 |
| Poly(2,2,2-trichloro-ethyl acrylate) | 13.0 | 20 | 2.0 | .05 | .12 |
| Poly(2-chloroethyl acrylate) | 13.5 | 20 | 2.0 | .05 | .12 |
| Poly(2,3-dichloro-1-propyl methacrylate) | 13.8 | 20 | 2.0 | — | .08 |
| Poly(chloroprene) | 13.4 | 20 | 7.0 | .01 | .02 |
| Poly(vinyl chloride) | 13.0 | 20 | 8.0 | faint | faint grainy |
| Poly(butene-1 sulfone) | 7.4 | 22.4 | 7.0 | .02 | .07 |
| Poly(styrene) | 1.0 | — | — | — | — |

These results also show that the acrylic and methacrylic polymers have especially high relative removal rates and high $NT_d$ values for relatively low radiation doses.

In addition, it is believed that brominated polymers may be very useful as the host material, as they absorb relatively well the X-ray wavelengths around 4.6 Angstroms and 5.4 Angstroms, among others. These wavelengths are produced by electron bombardment of rhodium and molybdenum targets, respectively. These are preferred targets in many cases due to their ability to withstand greater power densities and thus produce higher X-ray output powers than most other targets. Also, brominated polymers are removed by an oxygen plasma, although not as rapidly as chlorinated polymers tested thus far.

However, the result of tests with poly(2,3-dibromo-1-propyl acrylate), which is the bromine homologue of DCPA, and NVC indicate a very small differential etch ratio as compared with DCPA and NVC. This is probably due to a relatively low percentage of monomer material being locked into the host brominated polymer, which in turn is probably due to a low initiation rate for the brominated polymer. However, it is believed likely that silicon containing monomers, and mixed silicon-nonsilicon monomers in a brominated host polymer may yield acceptable differential etch ratios. This belief is based on the demonstrated resistance of silicon containing monomer material, even with low percentages of locked monomer, to oxygen plasma etching in the case of chlorinated host polymers.

The DCPA-monomer combinations shown in Table I are useful at X-ray wavelengths. However, for use with visible and ultraviolet radiation, a sensitizer is preferably added to aid the polymerization of the monomer material. Phenanthroquinone (PQ), has been found to be a useful sensitizer for the DCPA-NVC combination, allowing polymerization of the NVC monomer by radiation in the wavelength range of about 4500 to 2800 Angstroms. Other appropriate sensitizers could be used to extend the radiation sensitivity further into the visible spectrum if desired.

The characteristics of the oxygen plasma have an important effect on the etching process. Firstly, the etching process proceeds more rapidly the higher the temperature of the etching system. However, too high a temperature leads to disadvantageous formation of particulate deposits of organic material on the film. Further, the rate of removal may become too high for precise control of the stop time if the temperature is too high. Temperatures in the range of 20 degrees C. (ambient room temperature) to 60 degrees C. have been found suitable for the DCPA-NVC combination, with even higher temperatures possible. Secondly, the oxygen plasma used for the examples given herein was obtained in a "barrel" type plasma reactor of the type previously noted, but improved uniformity has been found in many cases when a reactive ion etcher was employed. The plasma referred to herein may be produced by either type apparatus, with still others being possible. The reactive ion etcher imparts an electrical bias to the substrate and accelerates the ions across a "dark space". However, the removal of resist material is still primarily due to chemical reaction, in turn dependent upon reactant species in the oxygen plasma. Thus, "plasma etching" is to be distinguished from procedures, such as ion milling, where momentum exchange is the primary removal mechanism. It is, of course, inherent that some momentum exchange occurs due to the plasma field itself. Accordingly, whereas resist removal is not primarily due to momentum exchange, momentum exchange does occur and, in fact, may be responsible in part for initiating or enhancing chemical activity.

In addition, to achieve a uniform thickness of the resist pattern, for the differential plasma etch ratios achieved thus far, it is important that the substrate on which the resist is placed be as flat as possible. For this reason, the present invention in many cases is preferentially practiced with the technique described in U.S. Patent Application Ser. No. 941,369.

Specific examples of some of the foregoing materials and treatments are provided below. These indicate more fully the processing steps involved. In particular, the step of fixing the pattern after irradiation varies with the specific monomer or monomers and polymer material used. This depends on such factors as volatility of the monomer material and the degree to which the monomer-polymer film can withstand high temperatures without thermal locking of the monomer material in the host polymer. The fixing temperature and vacuum conditions can be varied to yield various tradeoffs in terms of differential etch ratio versus processing speed.

EXAMPLE 1

A solution containing by weight 93 parts chlorobenzene, 7 parts poly(2,3-dichloro-1-propyl acrylate) having an intrinsic viscosity [n]=2.00 dl/g in ethyl acetate at 30 degrees C. and 1.64 parts N-vinylcarbazole was spincoated onto a silicon substrate at 3,500 rpm to give a 1 μm thick coating. It was selectively irradiated for 1 minute by $Pd_{L\alpha}$ X-radiation in an X-ray radiation system. The X-ray flux incident on the resist coating was 2.9 mj/cm$^2$/min. After irradiation, the substrate was placed in a vacuum oven for 1 hour. A range of temperatures was used successfully, with the most useful range being from ambient to 100 degrees C. The ultimate vacuum was 0.03 torr. The substrate was removed from the oven. The coating thicknesses remaining in the irradiated, $T_i$, and unirradiated, $T_u$, regions were 8800 Angstroms and 8100 Angstroms, respectively, affording a relief image thickness, $T_r = T_i - T_u = 700$ Angstroms. Treatment of the substrate with an unshielded oxygen plasma at 0.55 torr O$_2$ and 1.65 mw/cm$^3$ power density over a temperature range from 25 degrees C.–60 degrees C. for 3.3 minutes gave $T_i = 1400$ Angstroms and $T_u = 0$ Angstroms. The difference in removal rates for the unirradiated and irradiated regions was approximately 210 Angstroms/min., the unirradiated region being removed at a faster rate. The differential etch ratio was 1.09. The smallest feature resolved had submicrometer dimensions.

EXAMPLE 2

A solution containing by weight 92 parts chlorobenzene, 8 parts of poly(2,3-dichloro-1-propyl methacrylate), and 2 parts N-vinylcarbazole was spincoated onto a silicon substrate at 2500 rpm to give a 1.05 μm thick film. The sample was selectively irradiated by 4 minutes of X-radiation as above and was heated in vacuum at 0.05 torr and 90 degrees C. for 1 hour to give $T_i=8700$ Angstroms, $T_u=8100$ Angstroms, and $T_r=600$ Angstroms. Plasma treatment as above for 2.52 minutes gave $T_i=1400$ Angstroms for $T_u=0$ Angstroms. The difference in removal rates for the irradiated and unirradiated regions was 320 Angstroms/min. The differential etch ratio was 1.11. Submicrometer features were resolved.

EXAMPLE 3

A solution containing by weight 90 parts chlorobenzene, 10 parts poly(1,3-dichloro-2-propyl acrylate), and 4.3 parts N-vinylcarbazole was spincoated onto a silicon substrate at 3500 rpm to give a 1.20 μm thick film. It was selectively irradiated for 2.5 minutes as above and fixed as in Example 3. This afforded $T_i=9800$ Angstroms, $T_u=9200$ Angstroms, and $T_r=600$ Angstroms. Plasma treatment as above for 2.75 minutes afforded $T_i=1800$ Angstroms for $T_u=0$ Angstroms. The difference in removal rates for the irradiated and unirradiated regions was 220 Angstroms/min. The differential etch ratio was 1.15. Features having submicrometer dimensions were resolved.

EXAMPLE 4

A solution containing by weight 90 parts chlorobenzene, 10 parts poly(2-chloroethyl acrylate), and 1.11 parts N-vinylcarbazole was spincoated onto a silicon substrate at 2000 rpm to give a 1.07 μm thick uniform coating. Samples containing 2.5 parts N-vinylcarbazole gave nonuniform, splotchy films upon spincoating. This indicated phase separation had occurred at the higher N-vinylcarbazole concentration. The lower concentration sample was selectively irradiated as in the previous examples for 4 minutes and heated overnight in vacuum at 90 degrees C. thus affording $T_i=9400$ Angstroms, $T_u=9000$ Angstroms, and $T_r=400$ Angstroms. Plasma treatment as above for 5.22 minutes gave $T_i=1600$ Angstroms for $T_u=0$ Angstroms. The difference in removal rates for the unirradiated and irradiated regions was 230 Angstroms/min. The differential etch ratio was 1.15. Features having submicrometer dimensions were resolved.

EXAMPLE 5

A solution containing by weight 88 parts of chlorobenzene, 12 parts of poly(2,3-dichloro-1-propyl acrylate) and 0.63 parts N-phenylmaleimide was spincoated onto a silicon substrate at 4000 rpm to give a 1.0 μm thick coating. The $[\eta]$ of the polymeric component was 0.80 dl/g in ethyl acetate at 30 degrees C. The sample was selectively irradiated as in the above examples by 2.0 minutes of X-radiation. The sample was placed in vacuum at 30 degrees C. for 2 hours and then overnight at 90 degrees C. also in vacuum. No difference in $T_i=9300$ Angstroms, $T_u=9000$ Angstroms, and $T_r=300$ Angstroms was noted after treatment at higher temperature. The sample was plasma treated as above for 4.1 minutes to give $T_i=1300$ Angstroms for $T_u=0$ Angstroms. The difference in removal rates in the unirradiated and irradiated regions was 245 Angstroms/min. The differential etch ratio was 1.13. Features having submicrometer dimensions were resolved.

EXAMPLE 6

A solution containing by weight 88 parts of chlorobenzene, 12 parts of poly(2,3-dichloro-1-propyl acrylate) and 0.63 parts diphenyldivinylsilane was spincoated onto a silicon substrate at 2000 rpm to give a 1.01 μm thick coating. The sample was selectively irradiated as in the above examples for 3.0 minutes. It was placed in vacuum at 30 degrees C. for 2 hours to give a faint relief image (<200 Angstroms) which was not changed by further heating in vacuum at 85 degrees C. for 4 hours ($T_i \approx T_u = 9600$ Angstroms). Plasma treatment as above for approximately 4 minutes gave $T_i=2200$ Angstroms and $T_u=0$ Angstroms giving a difference in removal rates of approximately 550 Angstroms/min. The differential etch ratio was 1.30. Features having submicrometer dimensions were resolved.

EXAMPLE 7

A solution containing by weight 93 parts chlorobenzene, 7 parts poly(2,3-dichloro-1-propyl acrylate) with $[\eta]=2.00$ dl/g in ethyl acetate at 30 degrees C., and 0.78 parts 2-(1-naphthyl)ethyl acrylate was spincoated onto a silicon substrate at 2500 rpm to give a 9900 Angstrom thick coating. The sample was selectively irradiated with X-radiation as above for 8.0 minutes and was heated for 2 hours at 90 degrees C. in vacuum giving $T_i=9000$ Angstroms, $T_u=8300$ Angstroms, and $T_r=700$ Angstroms. Plasma treatment as above for 2.1 minutes gave $T_i=1500$ Angstroms for $T_u=0$ Angstroms. The difference in plasma removal rates was 380 Angstroms/min. The differential etch ratio was 1.11. Features having submicrometer dimensions were resolved. Nearly identical results were obtained when the 2-(1-naphthyl)ethyl acrylate was replaced with 2-(1-naphthyl)ethyl methacrylate.

EXAMPLE 8

A solution containing by weight 93 parts chlorobenzene, 7 parts poly(2,3-dichloro-1-propyl acrylate), 1.31 parts N-vinylcarbazole and 0.44 parts dimethylphenyl-4-vinylphenylsilane was spincoated onto a silicon substrate at 3300 rpm to give a 1.0 μm thick coating. The silane was prepared by the addition of a tetrahydrofuran solution of dimethylphenylsilylchloride to the Grignard reagent prepared from 4-chlorostyrene and Mg in tetrahydrofuran solution. The silane was not itself soluble in the poly(2,3-dichloro-1-propyl acrylate); the addition of N-vinylcarbazole enabled solubilization in the host polymeric material. The coated substrate was selectively irradiated as above with 1 minute of X-radiation and was placed in a vacuum for 3 hours at 30 degrees C. giving $T_i=8300$ Angstroms, $T_u=7800$ Angstroms, and $T_r=500$ Angstroms. Plasma treatment as above for 3.1 minutes gave $T_i=2200$ Angstroms for $T_u=0$ Angstroms. The difference in removal rates was 560 Angstroms/min. The differential etch ratio was 1.28. Features having submicrometer dimensions were resolved.

EXAMPLE 9

A solution containing by weight 88 parts chlorobenzene, 12 parts poly(2,3-dichloro-1-propyl acrylate), 3 parts N-phenylmaleimide, and 3 parts dimethylphenyl-4-vinylphenylsilane described in Example 8 was spincoated onto a silicon substrate at 7300 rpm to give a 1.0 μm thick coating. The sample was selectively irradiated with X-radiation as above for 1 minute and placed under vacuum for 2 hours at 30 degrees C. A relief image was formed where $T_i=6400$ Angstroms, $T_u=6200$ Angstroms, $T_r=200$ Angstroms. Plasma treatment as above for 1.98 minutes afforded $T_i=1300$ Angstroms and $T_u=0$ Angstroms. The difference in plasma removal rates was 560 Angstroms/min. The differential etch ratio was 1.22. Features with submicrometer dimensions were resolved.

EXAMPLE 10

A solution containing by weight 88 parts chlorobenzene, 12 parts poly(2,3-dichloro-1-propyl acrylate), 2.3 parts N-vinylcarbazole, and 7.5 parts diphenyldivinylsilane was spincoated onto a silicon substrate at 6000 rpm to give a 1.0 μm thick coating. The sample was selectively irradiated with X-radiation as above for 0.5 min followed by placement in vacuum for 2 hours at 30 degrees C. to give $T_i=7500$ Angstroms, $T_u=6800$ Angstroms, and $T_r=700$ Angstroms. Plasma treatment as above for 2.32 minutes afforded $T_i=1800$ Angstroms and $T_u=0$ Angstroms. The difference in removal rates was 470 Angstroms/min. The differential etch ratio was 1.19. Features having submicrometer dimensions were resolved.

In addition to the above compositions and process, various additional modifications and extensions of this invention will become apparent to those skilled in the art. For example, plasma atmospheres other than oxygen may be developed for differential plasma etching. Also, various sensitizers may be found suitable for use with various radiation sources. All such variations and deviations which basically rely on the teachings through which this invention has advanced the art are properly considered to be within the spirit and scope of this invention.

I claim:

1. A method of producing a solid state device including at least one pattern delineation step by steps comprising:
   (a) selectively irradiating a resist film on a substrate with actinic radiation;
   (b) treating said film to fix the pattern; and
   (c) exposing said film to a plasma to produce a negative resist pattern;
   the invention characterized in that said film comprises a polymer and at least one type of monomer, and characterized further in that the step of selectively irradiating the film locks the monomer or monomers in the portions of the film that are selectively irradiated, the step of treating the film reduces the amount of unlocked monomer or monomers in the film, and the step of exposing the film to a plasma removes the unirradiated portion of the film at a faster rate than the irradiated portion due to the presence of the locked monomer or monomers in the irradiated portion of the film, so that the differential etch ratio is at least 1.05.

2. The method of claim 1 further characterized in that at least one type of monomer grafts to said polymer in said film upon irradiation by said actinic radiation.

3. The method of claim 1 further characterized in that at least one type of monomer dimerizes upon irradiation by said actinic radiation.

4. The method of claim 1 further characterized in that at least one type of monomer polymerizes upon irradiation by said actinic radiation.

5. The method of claim 1 further characterized in that at least one type of monomer is an aromatic monomer having at least one unsaturated polymerizable functional group.

6. The method of claim 1 further characterized in that at least one type of monomer is a silicon containing monomer.

7. The method of claim 6 further characterized in that one type of monomer is diphenyldivinylsilane.

8. The method of claim 6 further characterized in that one type of monomer is dimethylphenyl-4-vinylphenylsilane.

9. The method of claim 6 further characterized in that at least one type of monomer is a nonsilicon containing aromatic monomer having at least one unsaturated polymerizable functional group.

10. The method of claims 5, 6, 7, 8 or 9 further characterized in that one monomer type is N-vinylcarbazole.

11. The method of claims 1, 5, 6 or 9 further characterized in that said polymer is a chlorinated polymer.

12. The method of claim 11 further characterized in that said polymer is poly(2,3-dichloro-1-propyl acrylate).

13. The method of claims 6, 7, 8 or 9 further characterized in that said polymer is a brominated polymer.

14. The method of claim 1 further characterized in that said polymer is a halogenated acrylic or methacrylic polymer.

15. The method of claim 1 further characterized in that the selective irradiation of part (a) comprises directing said actinic radiation through a mask onto said film, said mask containing the desired pattern in the form of localized regions of high transmission of said radiation.

16. The method of claim 1 further characterized in that said radiation source is an X-ray radiation source.

17. The method of claim 1 further characterized in that said plasma comprises oxygen.

18. The method of claim 13 further characterized in that said plasma comprises oxygen.

19. The method of claim 1 further characterized in that said film further comprises a sensitizer to facilitate the locking of said monomer or monomers in said polymer by means of electromagnetic radiation of a given wavelength.

20. The method of claim 19 further characterized in that said sensitizer is phenanthroquinone.

21. The method of claims 1, 2, 3, 4, 5, 6, 7, 8, 9, 14, 15, 16, 17, 19, or 20 further characterized in that the differential etch ratio is at least 1.20.

22. A method of producing a solid state device including at least one pattern delineation step by steps comprising:
   (a) selectively irradiating a resist film on a substrate with actinic X-ray radiation;
   (b) treating said film to fix the pattern; and
   (c) exposing said film to a plasma comprising oxygen to produce a negative resist pattern;

the invention characterized in that said film comprises a chlorinated acrylic or methacrylic polymer and at least one type of aromatic monomer having one or more unsaturated polymerizable functional groups, and characterized further in that the step of selectively irradiating the film locks the monomer or monomers into said polymer in those portions of the film that are selectively irradiated, the step of treating the film reduces the amount of unlocked monomer or monomers in the film, and the step of exposing the film to a plasma comprising oxygen removes the unirradiated portion of the film at a faster rate than the irradiated portion due to the presence of the locked monomer or monomers in the irradiated portion of the film, so that the differential etch ratio is at least 1.05.

23. The method of claim 22 further characterized in that said polymer is poly(2,3-dichloro-1-propyl acrylate).

24. The method of claim 22 or 23 further characterized in that one type of monomer is N-vinylcarbazole.

25. The method of claim 23 further characterized in that one type of monomer is N-vinylcarbazole forming 5 to 20 percent by weight of said film.

26. The method of the claim 22 further characterized in that at least one type of monomer is a silicon containing monomer.

27. The method of claim 26 further characterized in that one type of monomer is diphenyldivinylsilane.

28. The method of claim 26 further characterized in that one type of monomer is dimethylphenyl-4-vinylphenylsilane.

29. The method of claims 26, 27 or 28 further characterized in that one type of monomer is N-vinylcarbazole.

30. The method of claim 29 further characterized in that said polymer is poly(2,3-dichloro-1-propyl acrylate).

31. The method of claims 22, 23, 25, 26, 27, or 28 further characterized in that the differential etch ratio is at least 1.20.

32. The method of claims 1 or 22 further characterized in that the normalized thickness of the relief image after fixing, NTr, is less than 0.10.

33. The method of claim 21 further characterized in that the normalized thickness of the relief image after fixing, NTr, is less than 0.10.

34. The method of claim 31 further characterized in that the normalized thickness of the relief image after fixing, NTr, is less than 0.10.

* * * * *